United States Patent  [19]
Ueda

[11] Patent No.: US 6,203,969 B1
[45] Date of Patent: Mar. 20, 2001

[54] RESIST PROCESSING APPARATUS WHICH MEASURES TEMPERATURE OF HEAT-SENSING SUBSTRATE AND MEASURING METHOD THEREIN

[75] Inventor: Tatsuji Ueda, Round Rock, TX (US)

[73] Assignee: Tokyo Electron Limited, Tokyo (JP)

[*] Notice: Subject to any disclaimer, the term of this patent is extended or adjusted under 35 U.S.C. 154(b) by 0 days.

[21] Appl. No.: 09/152,391

[22] Filed: Sep. 14, 1998

[51] Int. Cl.[7] .................................................. G03C 5/00

[52] U.S. Cl. .............................. 430/330; 118/712; 118/66

[58] Field of Search ........................... 118/666, 66, 58, 118/712; 430/330, 20; 438/14, 388, 795

[56] References Cited

FOREIGN PATENT DOCUMENTS 9-189613    7/1997   (JP).

*Primary Examiner*—Brenda A. Lamb
(74) *Attorney, Agent, or Firm*—Rader, Fishman & Grauer

[57] ABSTRACT

In a resist processing apparatus, a thermocouple wafer substrate is set to stand by in the predetermined position in advance. When the measurement of the temperature of a substrate in a thermal processing unit is necessary, the thermocouple wafer is carried into the thermal processing unit. After the thermocouple wafer carried in the thermal processing unit is heat-treated, the temperature of the heat-treated thermocouple wafer sensed by a heat sensor is measured. Thus, the temperature of the heat-treated substrate can be measured with accuracy, with the smallest influence available on a loss of time in operation of the apparatus, and without any human error.

21 Claims, 7 Drawing Sheets

RESIST PROCESSING APPARATUS WHICH MEASURES TEMPERATURE OF HEAT-SENSING SUBSTRATE AND MEASURING METHOD THEREIN

BACKGROUND OF THE INVENTION

The present invention relates to a resist processing apparatus for coating a substrate with a resist, sending the substrate to an aligner and developing the substrate received from the aligner, and a measuring method therein.

In a photo-resist process of semiconductor device fabrication, a resist solution is coated on a surface of a substrate such as a semiconductor wafer, which is called a wafer hereinafter, to form a resist film. After the predetermined pattern is exposed on the resist film, the substrate is supplied with a developing solution and developed. A resist processing apparatus and an aligner have been used so far in a series of the above processes.

The resist processing apparatus is provided with processing units which individually perform a series of processes necessary for coating and developing, that is, an adhesion unit, a coating unit, a thermal processing unit, a developing unit and the like. An adhesion unit performs adhesion treatment to improve resist fixing. A coating unit coats a substrate with resist solution. A thermal processing unit heats a substrate coated with resist solution to cure a resist film. Another thermal processing unit heats an exposed substrate at the predetermined temperature. A developing unit develops an exposed substrate. A carrier unit is used for carrying a wafer between each processing unit or carrying a wafer into and out from each processing unit, a carrier unit, for example, being able to move while holding a wafer.

Temperature control in the above thermal processing unit is very important. Poor temperature control causes poor film thickness and poor developing of resist. Therefore, not the temperature in a thermal processing unit, but the real temperature of a wafer in a thermal processing unit may be measured using, for example, a wafer in which a thermocouple is buried.

More concretely, when measurement is necessary, the real operation of the resist processing unit is suspended and a cover of the thermal processing unit is opened. After the thermocouple wafer is placed in a position in which wafers are heat-treated in the thermal processing unit, the thermocouple wafer is heat-treated in an ordinary heat treatment. In a temperature measuring apparatus, the temperature is measured through the thermocouple buried in the thermocouple wafer and a measured result is processed. That is, the thermocouple wafer is not measured in the thermal processing unit. This is because a plurality of cables coupled between the thermocouple wafer and the temperature measuring apparatus interfere with normal shutting of the cover in the thermal processing unit. Additionally, a setting error cannot be prevented because the thermocouple wafer is manually placed in the thermal processing unit.

A series of the above processes is, however, performed manually so that it is difficult to exactly measure the temperature of a heat-treated wafer.

Moreover, the manual measurement described above requires suspension of the real operation for a considerable time, which results in a loss in apparatus operation time.

There is another disadvantage that the above measurement may lead to some human error. For example, a thermocouple wafer may be dropped from tweezers and be broken.

BRIEF SUMMARY OF THE INVENTION

The present invention is provided in view of the aforesaid disadvantages.

An object of the present invention is to provide a resist processing apparatus which can accurately measure the temperature of a heat-treated substrate and a measuring method therein.

Another object of the present invention is to provide a resist processing apparatus which can measure the temperature of a heat-treated substrate with the smallest possible loss of apparatus operation time and a measuring method therein.

Still another object of the present invention is to provide a resist processing apparatus which can measure the temperature of a heat-treated substrate without any human error and a measuring method therein.

To attain the above-described objects, a resist processing apparatus in the first aspect of the present invention coats a substrate with a resist, sends the substrate to an aligner and develops the substrate received from the aligner. The resist processing apparatus is provided with a thermal processing unit for heat-treating the substrate received at least from the aligner, a carrier mechanism for carrying the substrate at least between the aligner and the thermal processing unit, a buffer unit where a heat-sensing substrate provided with a heat sensor stands by, and a measuring means disposed in the thermal processing unit for measuring the temperature of the heat-sensing substrate sensed by the heat sensor, the heat-sensing substrate being heat-treated in the thermal processing unit after being carried from the buffer unit to the thermal processing unit by the carrier mechanism.

A resist processing apparatus in the second aspect of the present invention coats a substrate with a resist, sends the substrate to an aligner and develops the substrate received from the aligner. The resist processing apparatus is provided with a thermal processing unit for heat-treating the substrate, a buffer unit where a heat-sensing substrate provided with a heat sensor and a storage element for storing a result sensed by the heat sensor stands by, and a reading means for reading the sensed result stored in the storage element of the heat-sensing substrate heat-treated in the thermal processing unit.

A resist processing apparatus in the third aspect of the present invention coats a substrate with a resist, sends the substrate to an aligner and develops the substrate received from the aligner. The resist processing apparatus is provided with a thermal processing unit for heat-treating the substrate, a buffer unit where a heat-sensing substrate provided with a heat sensor and a transmitter for transmitting by radio a result sensed by the heat sensor stands by, and a receiving means for receiving the sensed result transmitted from the transmitter of the heat-sensing substrate heat-treated in the thermal processing unit.

A measuring method in the fourth aspect of the present invention is a measuring method with the following steps in an apparatus for coating a substrate with a resist, sending the substrate to an aligner and developing the substrate received from the aligner. A heat-sensing substrate provided with a heat sensor needs to be set to stand by in advance. The heat-sensing substrate is carried in a thermal processing unit, which heat-treats a substrate received from the aligner, in the predetermined timing. The carried heat-sensing substrate is heat-treated in the thermal processing unit. In addition, the temperature of the heat-treated heat-sensing substrate sensed by a heat sensor is measured.

A measuring method in the fifth aspect of the present invention is a measuring method with the following steps in an apparatus for coating a substrate with a resist, sending the substrate to an aligner and developing the substrate received from the aligner. A heat-sensing substrate provided with a heat sensor and a storage element for storing a result sensed by the heat sensor needs to be set to stand by in advance. The heat-sensing substrate is carried in a thermal processing unit, which heat-treats a substrate received form the aligner, in the predetermined timing. The carried heat-sensing substrate is heat-treated in the thermal processing unit. In addition, the sensed result stored in the storage element of the heat-treated heat-sensing substrate is read.

A measuring method in the sixth aspect of the present invention is a measuring method with the following steps in an apparatus for coating a substrate with a resist, sending the substrate to an aligner and developing the substrate received from the aligner. A heat-sensing substrate provided with a heat sensor and a transmitter for transmitting by radio a result sensed by the heat sensor needs to be set to stand by in advance. The heat-sensing substrate is carried in a thermal processing unit, which heat-treats a substrate received from the aligner, in the predetermined timing. The carried heat-sensing substrate is heat-treated in the thermal processing unit. In addition, the sensed result transmitted from the transmitter of the heat-treated heat-sensing substrate is received.

In the present invention, a heat-sensing substrate is set to stand by in advance. When the measurement of the temperature of a substrate in a thermal processing unit is required, the heat-sensing substrate is carried in the thermal processing unit. After the heat-sensing substrate is heat-treated in the thermal processing unit, the temperature of the heat-treated heat-sensing substrate sensed by a heat sensor is measured. Thus, the temperature of the heat-treated substrate can be measured with accuracy, with the smallest loss of apparatus operation time, and without any human error.

The above-described objects and still other objects and advantages of the present invention will become apparent upon reading the following specification when taken in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
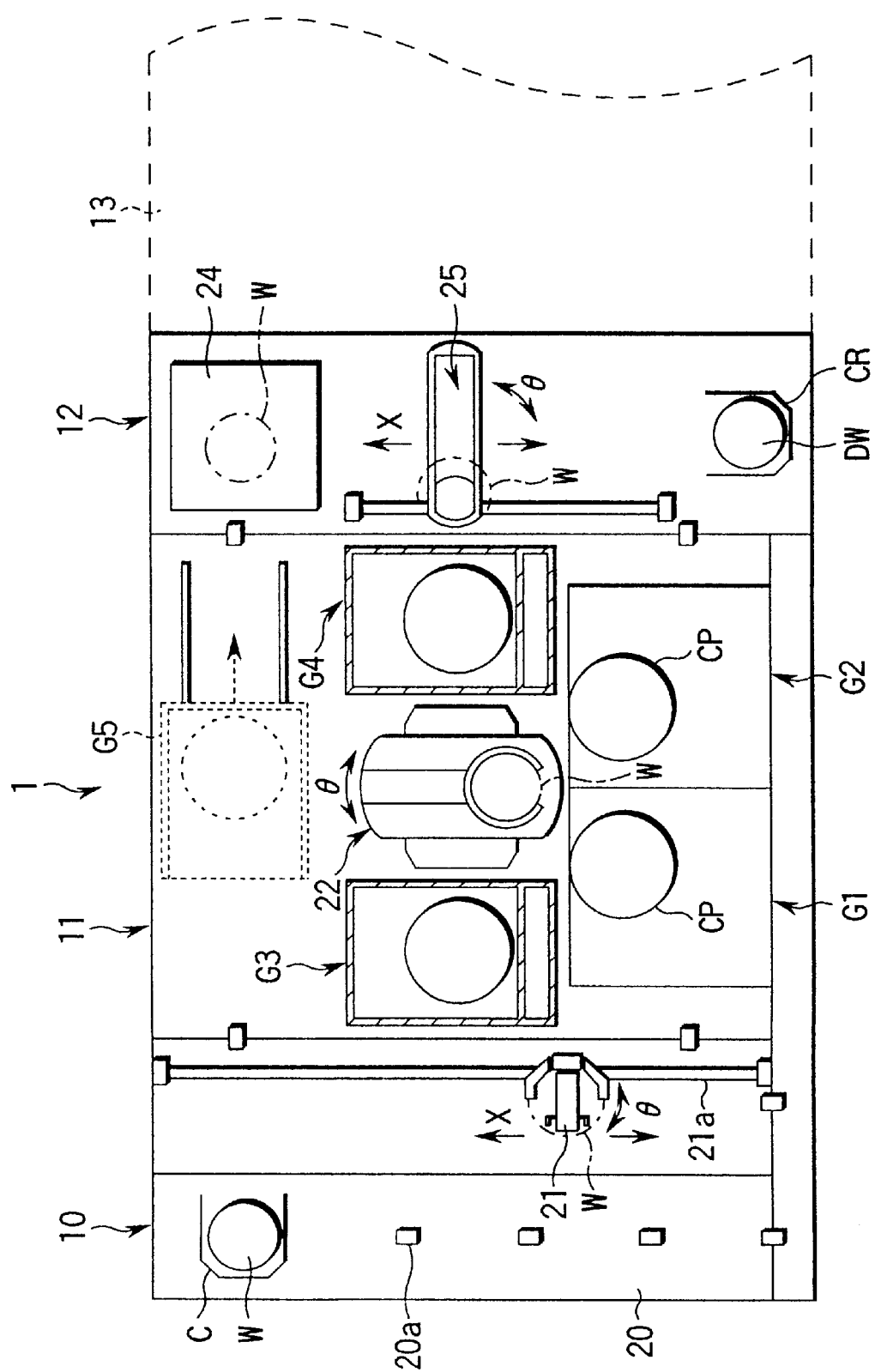
FIG. 1 is a plan view of a resist processing apparatus according to an embodiment of the present invention.

Certain terminology will be used in the following description for convenience of reference only and will not be limiting. The words "up", "down", "right" and "left" will designate directions in the drawings to which reference is made. The words "in" and "out" will refer to directions toward and away from, respectively, the geometric center of the device and designated parts thereof. Such terminology will include derivatives and words of similar import.

Figure 2:
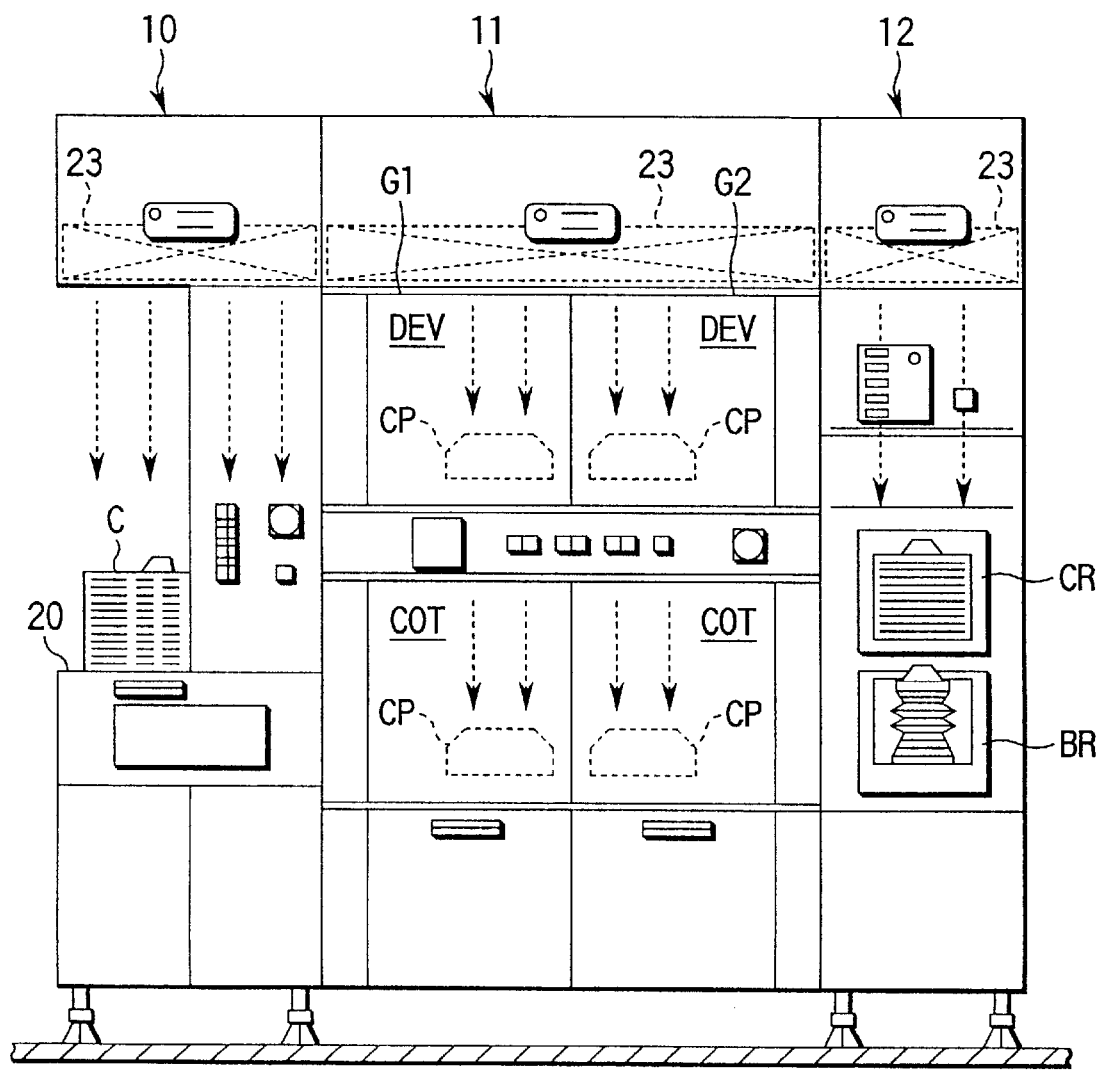
FIG. 2 is a front view of the resist processing apparatus shown in FIG. 1.
Figure 3:
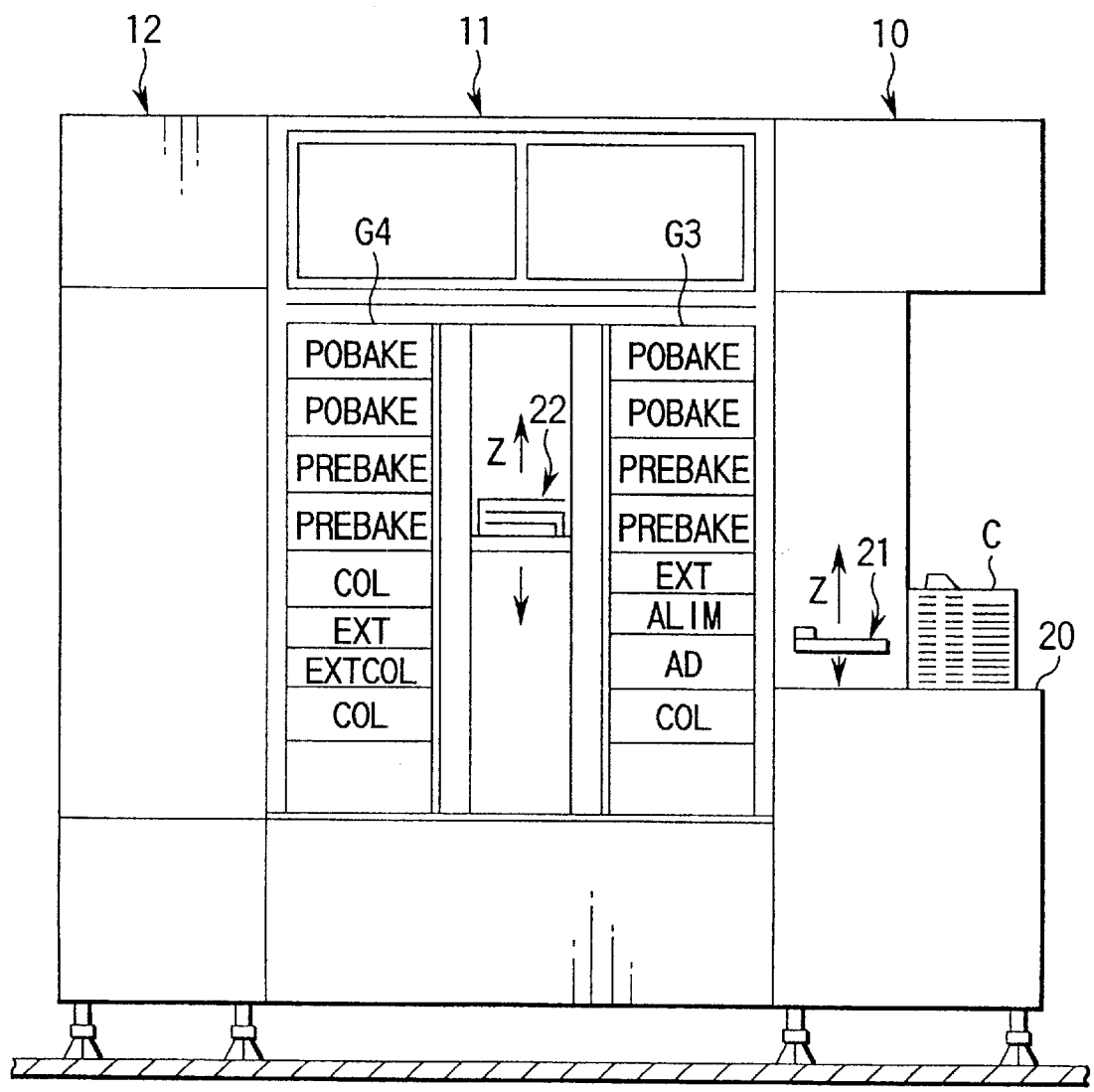
FIG. 3 is a rear view of the resist processing apparatus shown in FIG. 1.

As shown in FIGS. 1 to 3, a resist processing apparatus 1 is provided with a cassette station 10, a process station 11 and an interface unit 12, all of which are integrally connected. In the cassette station 10, more than one wafer W, for example, twenty-five wafers per cassette C are carried into the resist processing unit 1 from the outside and carried out from the resist processing unit 1 to the outside. The wafer W is carried into and out from the cassette C. In the process station 11, various kinds of processing units are multi-tiered in a predetermined position. Each processing unit applies a predetermined treatment to wafers W one by one in the process of coating and developing. In the interface unit 12, the wafer W is sent to and received from an aligner 13 which is disposed adjacent to the resist processing apparatus 1.

In the cassette station 10, as shown in FIG. 1, more than one, for example, four cassettes C are disposed respectively with a way in/out for each wafer W opening to the side of the process station 11 in a line in an X-direction (vertical direction in FIG. 1) in the position of each positioning projection 20a on a cassette stand 20 where cassettes are placed. A wafer carrier 21, which can move in the direction of disposition of cassettes C (X-direction) and in a direction of disposition of wafers W contained in the cassette C (Z-direction; vertical direction), is movable along a carrier path 21a to be able to selectively access each cassette C.

The wafer carrier 21 is rotatable in a θ-direction and can access an alignment unit (ALIM) and an extension unit (EXT) which belong to a multi-tiered units of a third processing unit group G3 in the side of the process station 11 as described hereinafter.

In the process station 11, as shown in FIG. 1, a carrier unit 22 with a vertical carrier system is placed in a center portion. Around the carrier unit 22, one set or more than one set of various kinds of processing units are multi-tiered so as to compose processing unit groups. In the resist processing apparatus 1, five processing unit groups G1, G2, G3, G4 and G5 can be disposed. A first and a second processing unit group, G1 and G2, can be disposed in the front side of a system, the third processing unit group G3 can be disposed adjacent to the cassette station 10, a fourth processing unit group G4 can be disposed adjacent to the interface unit 12, and a fifth processing unit group G5 shown in a broken line can be disposed in the back side. The carrier unit 22 which is rotatable in a θ-direction and movable in a Z-direction can carry the wafer W into and out from each processing unit.

In the first processing unit group G1, as shown in FIG. 2, two spinner-type processing units in which a wafer W is mounted on a spin chuck in a cup CP in order to perform the predetermined processing, for example, a resist solution coating unit (COT) and developing unit (DEV) are dual stacked in that order from the bottom. In the second processing unit group G2 just like the first processing unit group G1, two spinner-type processing units, for example, a resist solution coating unit (COT) and developing unit (DEV) are dual stacked in that order from the bottom.

As shown in FIG. 2, in the upper portion of the resist processing unit 1, a high efficiency filter 23 such as a ULPA filter is disposed in each of the above-described three zones, that is, the cassette station 10, the process station 11, and the interface unit 12. Particles and organic components of air supplied from above the high efficiency filter 23 are collected and removed. Therefore, through the high efficiency filter 23, pure air flowing downward is supplied to the cassette stand 20, the carrier path 21a of the wafer carrier 21, the first and the second processing unit groups G1 and G2 described above, and the third to the fifth processing unit groups G3, G4 and G5 and the interface unit 12 which are described below in the direction of a solid line arrow or a dotted line arrow.

In the third processing unit group G3, as shown in FIG. 3, oven-type processing units in which the wafer W is mounted on a stand (not shown) in order to perform the predetermined processing, for example, a cooling unit (COL) for cooling processing, an adhesion unit (AD) for adhesion processing to improve fixing of the resist, an alignment unit (ALIM) for positioning, an extension unit (EXT), a prebaking unit (PREBAKE) for heat processing before coating, and a postbaking unit (POBAKE) are, for instance, eight-tiered in that order from the bottom.

Similarly, in the fourth processing unit group G4, as shown in FIG. 3, oven-type processing units in which the wafer W is mounted on a stand (not shown) in order to perform the predetermined processing, for example, a cooling unit (COL) for cooling processing, an extension & cooling unit (EXTCOL) serving both as extension unit and cooling unit, an adhesion unit (AD), a prebaking unit (PREBAKE), and a postbaking unit (POBAKE) are, for instance, eight-tiered in that order from the bottom.

As described above, the cooling unit (COL) and the extension & cooling unit (EXCOL), both requiring a low processing temperature, are disposed below, and the prebaking unit (PREBAKE), the postbaking unit (POBAKE) and the adhesion unit (AD), all three requiring a high processing temperature, are disposed above, thereby reducing thermal mutual interference between units.

As shown in FIG. 1, the interface unit 12 has the same dimension in the direction of depth (X-direction) as the process station 11, but a dimension in the direction of width smaller than the process station 11. As shown in FIGS. 1 and 2, a transportable pickup cassette CR and a fixed buffer cassette BR are dual tiered in the front side of the interface unit 12, and a peripheral exposing unit 24 is disposed in the back side thereof. In the transportable pickup cassette CR and the fixed buffer cassette BR, at least one thermocouple wafer DW, described hereinafter, is set to stand by in advance.

In the center portion of the interface unit 12, a wafer carrier 25 is disposed. The wafer carrier 25 moves in an X-direction and in a Z-direction (vertical direction) so as to be able to access both cassettes CR and BR, and the peripheral exposing unit 24. The wafer carrier 25 is also rotatable in a θ-direction to be able to access the extension unit (EXT) which belongs to the fourth processing unit group G4 in the side of the process station 11, and moreover a wafer delivery stand (not shown) in the side of the adjacent aligner 13.

Figure 4:
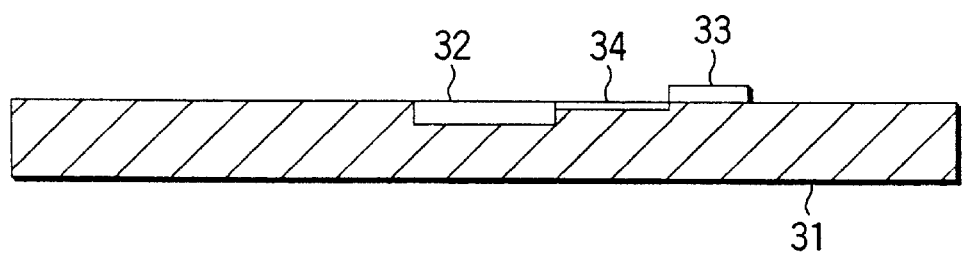
FIG. 4 is a front view of a thermocouple wafer according to an embodiment of the present invention.
Figure 5:
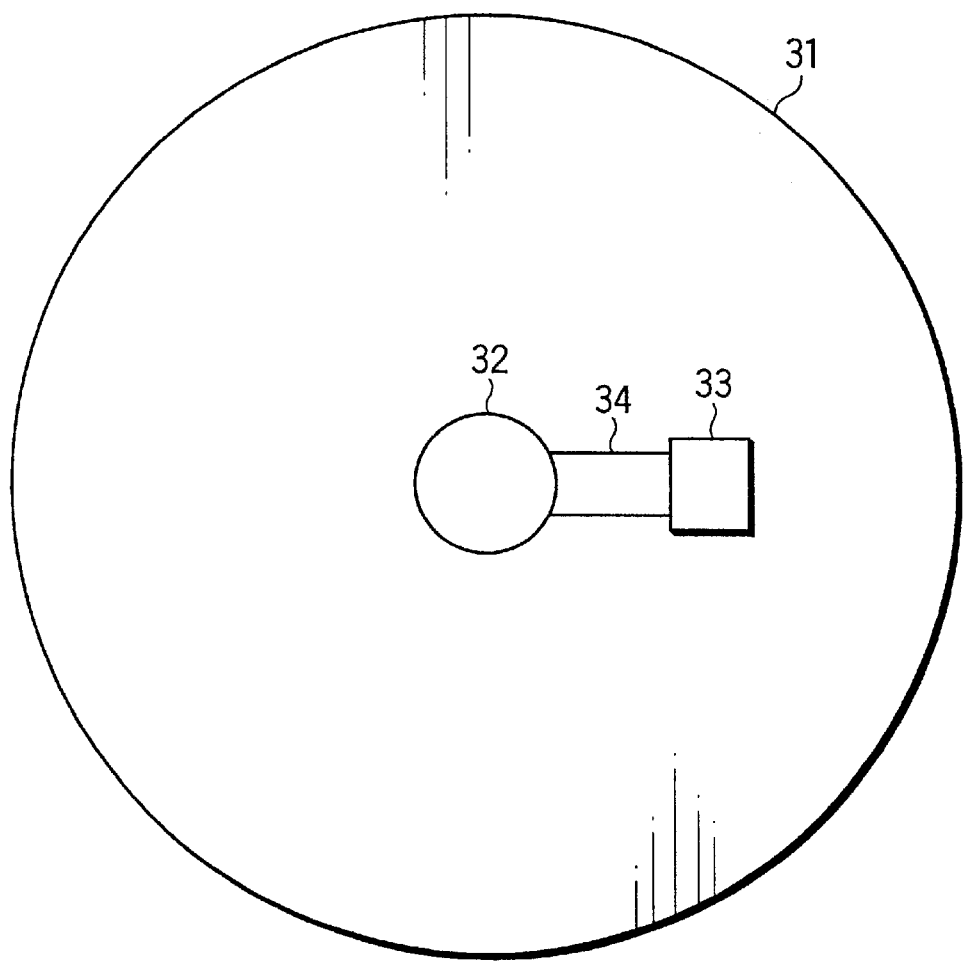
FIG. 5 is a plan view of the thermocouple wafer shown in FIG. 4.

As shown in FIGS. 4 and 5, in the thermocouple wafer DW, a thermocouple 32 serving as a heat sensor is buried in a body 31 which is basically a identical member to the wafer W. On a surface of the body 31, a terminal 33 is disposed. A pin for measurement described hereinafter touches the terminal 33 and a result sensed by the thermocouple 32 is outputted to the outside through the pin for measurement. The thermocouple 32 and the terminal 33 are electrically connected by wiring 34. Temperature distribution can be known by burying more than one thermocouple 32 in the body 31.

Figure 6:
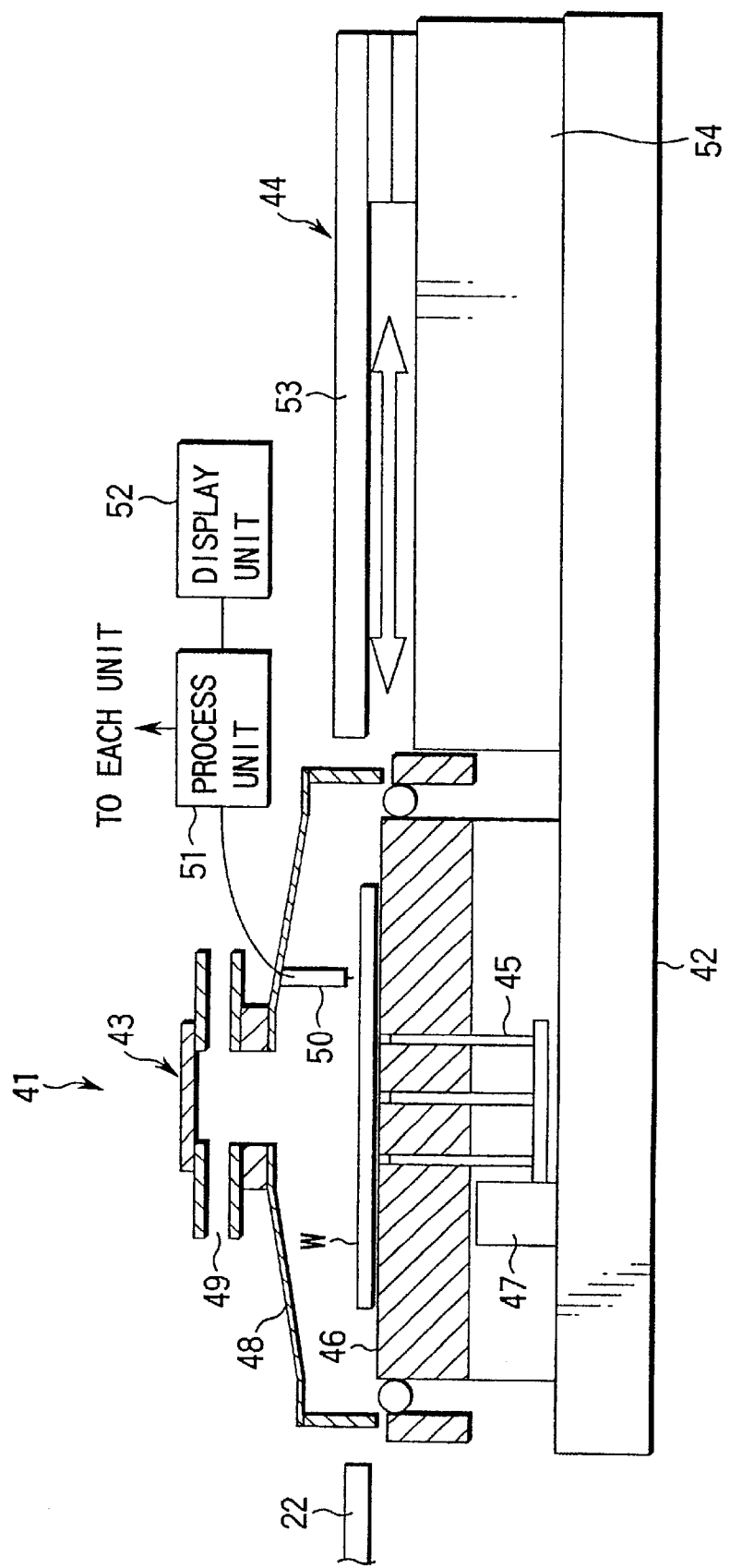
FIG. 6 is a front view of a chilling hot plate according to an embodiment of the present invention.

As shown in FIG. 6, as the postbaking unit (POBAKE) in the third processing unit group G3 and the fourth processing unit group G4, a chilling hot plate 41 is used for more accurate temperature control.

In the chilling hot plate 41, a thermal processing unit 43 and a cooling unit 44 are disposed adjacently on a base 42.

In the thermal processing unit 43, a supporting pin 45 which supports the wafer W is disposed so as to be able to both protrude from and sink into a surface of a hot plate 46. The supporting pin 45 moves vertically by means of a drive unit 47. When the wafer W is received from the carrier unit 22 and the like, the supporting pin 45 comes out from the surface of the hot plate 46 by the operation of the drive unit 47. When the wafer W is heat-treated, the supporting pin 45 sinks into the hot plate 46 as shown in FIG. 6. Moreover, a cover 48 is disposed to cover the upper portion of the wafer W. The cover 48 can be moved vertically by a drive unit (not shown). When the wafer W is sent to and received from the thermal processing unit 43, the cover 48 is opened. When the wafer W is heat-treated, the cover 48 is shut to form a processing space between the hot plate 46 and the cover 48 as shown in FIG. 6. On the top of the cover 48, an exhaust vent 49 is provided. Inside the cover 48, a pin for measurement 50 is disposed so as to touch the terminal 33 of the thermocouple wafer DW when the cover 48 is shut.

Figure 7:
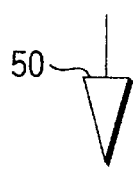
FIG. 7 is a fragmentary enlarged view of the chilling hot plate shown in FIG. 6.
Figure 8:
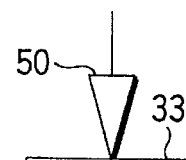
FIG. 8 is a fragmentary enlarged view of the chilling hot plate shown in FIG. 6.

When the cover 48 is shut, a point of the pin for measurement 50 does not touch a surface of the ordinary wafer W as shown in FIG. 7, but touches the terminal 33 of the thermocouple wafer DW as shown in FIG. 8 because the terminal 33 protrudes from the surface. From such a structure as the above, it is possible to take data from the thermocouple wafer DW without any special operation or control.

As shown in FIG. 6, the pin for measurement 50 is connected to a process unit 51 composed of a personal computer, for example, which processes data inputted through the pin 50. The process unit 51 sends the thermocouple wafer DW from a standby position into the thermal processing unit 43 at the predetermined timing, measures the temperature, and displays a result on a display unit 52 composed of a liquid crystal panel, for example.

The above-described predetermined timing required for measuring the temperature using the thermocouple wafer DW is
1) when maintenance is performed,
2) a unit of each lot of the wafer W,
3) when malfunction of the wafer is detected, and the like.

The malfunction of the wafer means poor exposure, poor film thickness of the resist, or the like.

As shown in FIG. 6, the cooling unit 44 in the chilling hot plate 41, a chill arm 53 is formed to be accessible into the thermal processing unit 43 by the operation of a drive unit 54.

In the chilling hot plate 43 structured as described above, the wafer W received from the carrier unit 22 on the left side in FIG. 6 is heat-treated in the thermal processing unit 43 and then sent to the cooling unit 44 to be cooled, and subsequently the cooled wafer W is transferred to the carrier unit 22 through the thermal processing unit 43.

In the resist processing apparatus with the above-described structure, the temperature measurement by the thermocouple wafer DW is performed in the following way.

When the temperature measurement is necessary, under the control of the process unit 51, the thermo-couple wafer DW, which stands by in the buffer cassette BR in the interface unit 12, for example, is carried into the postbaking unit (POBAKE) composed of the chilling hot plate 41 through the wafer carrier 25, the extension unit (EXT) and the carrier unit 22 in that order. The above course is the same as the course of the exposed ordinary wafer W. In other words, a buffer unit for the thermocouple wafer DW is disposed in a temperature atmosphere on a carrier path between the aligner 13 and the postbaking unit (POBAKE) so that the thermocouple wafer DW can follow the same course as the ordinary wafer W and be carried into the postbaking unit (POBAKE). As a result, the thermocouple wafer DW has the same heat history as the ordinary wafer W.

After the thermocouple wafer DW is carried into the chilling hot plate 41, the cover 48 is shut. At that moment, the pin for measurement 50 disposed inside the cover 48 touches the terminal 33 of the thermocouple wafer DW.

Subsequently the thermocouple wafer DW is heated under the same heating conditions as the ordinary wafer W in the chilling hot plate 41. A result sensed by the thermocouple 32 of the thermocouple wafer DW is inputted to the process unit 51 through the terminal 33 and the pin for measurement 50. A measured data processed by the process unit 51 is displayed in the display unit 52.

As described above, the thermocouple wafer DW has the same heat history as the ordinary wafer W. Thus the measured result of the thermocouple wafer DW is considered to be the same as that of the ordinary wafer W. In other words, the temperature of the wafer W heat-treated according to the present invention is accurately detected. And the obtained result is utilized for the temperature control during thermal processing, thereby reducing occurrence of poor exposure of a wafer, poor film thickness of a resist and the like.

Next, another embodiment of the present invention is described.

Figure 9:
FIG. 9 is a front view of a thermocouple wafer according to another embodiment.
Figure 10:
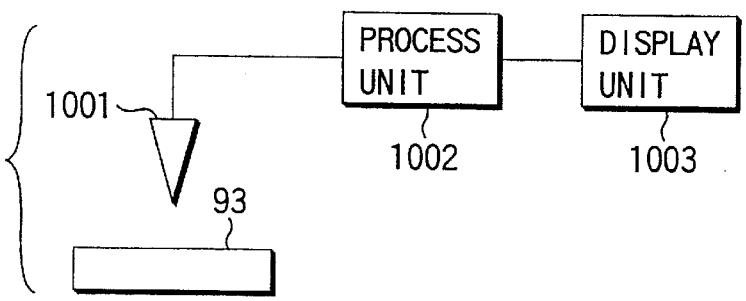
FIG. 10 is a block diagram showing a temperature data processing system when using the thermocouple wafer shown in FIG. 9.

In the embodiment, as shown in FIG. 9, a thermo-couple 91 is buried in the thermocouple wafer DW and a storage element 92 to store a result sensed by the thermocouple 91 is also provided in the thermocouple wafer DW. When the thermocouple wafer DW is made of the same silicon as a wafer W, the storage element 92 can be formed using the dummy substrate as a raw material of the thermocouple wafer DW, and a separately formed storage element 92 can be also buried in the thermocouple wafer DW. The data stored in the storage element 92 is outputted to the outside by a terminal 93.

On the other hand, for example, in either of the third or the fourth processing unit groups G3 or G4 close to the thermal processing unit, a reading unit is disposed. The reading unit is provided with a pin for measurement 1001 which touches the terminal 93 to input data, a process unit 1002 composed of a personal computer, for example, which processes the data inputted through the pin 1001, and a display unit 1003 composed of a liquid crystal panel, for example, which displays the result.

Next, still another embodiment of the present invention is described.

Figure 11:
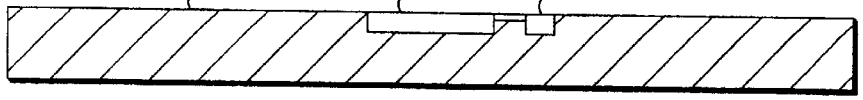
FIG. 11 is a front view of a thermocouple wafer according to still another embodiment.

In the embodiment, as shown in FIG. 11, a thermo-couple 1101 is buried in the thermocouple wafer DW and a transmitter 1102 which transmits by radio a result sensed by the thermocouple 1101 is also buried in the thermocouple wafer DW. The transmitter 1102 preferably uses infrared rays as radio, whereby a circuit is composed of heat-resistant parts.

Figure 12:
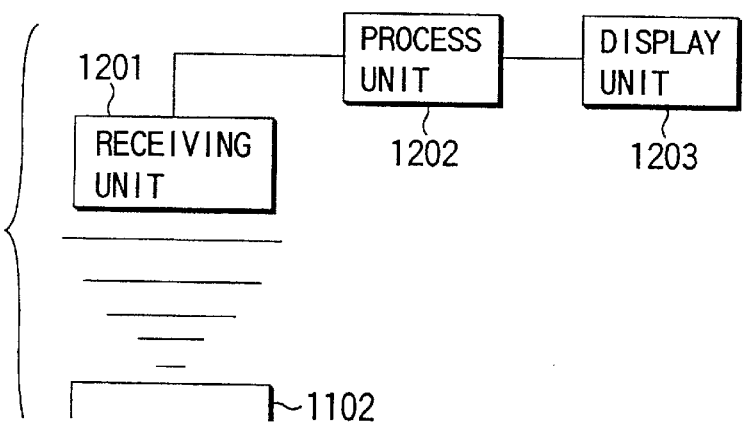
FIG. 12 is a block diagram showing a temperature data processing system when using the thermocouple wafer shown in FIG. 11.

On the other hand, for example, in either of the third or the fourth processing unit groups G3 or G4 close to the thermal processing unit, a receiving and data processing unit is disposed. As shown in FIG. 12, the receiving and data processing unit is provided with a receiving unit 1201 consisting of light receiving elements in case of infrared rays, for example, which receives a signal from the transmitter 1102, a process unit 1202 consisting of a personal computer, for example, which processes the data inputted through the receiving unit 1201, and a display unit 1203 consisting of a liquid crystal panel, for example, which displays the result.

Figure 13:
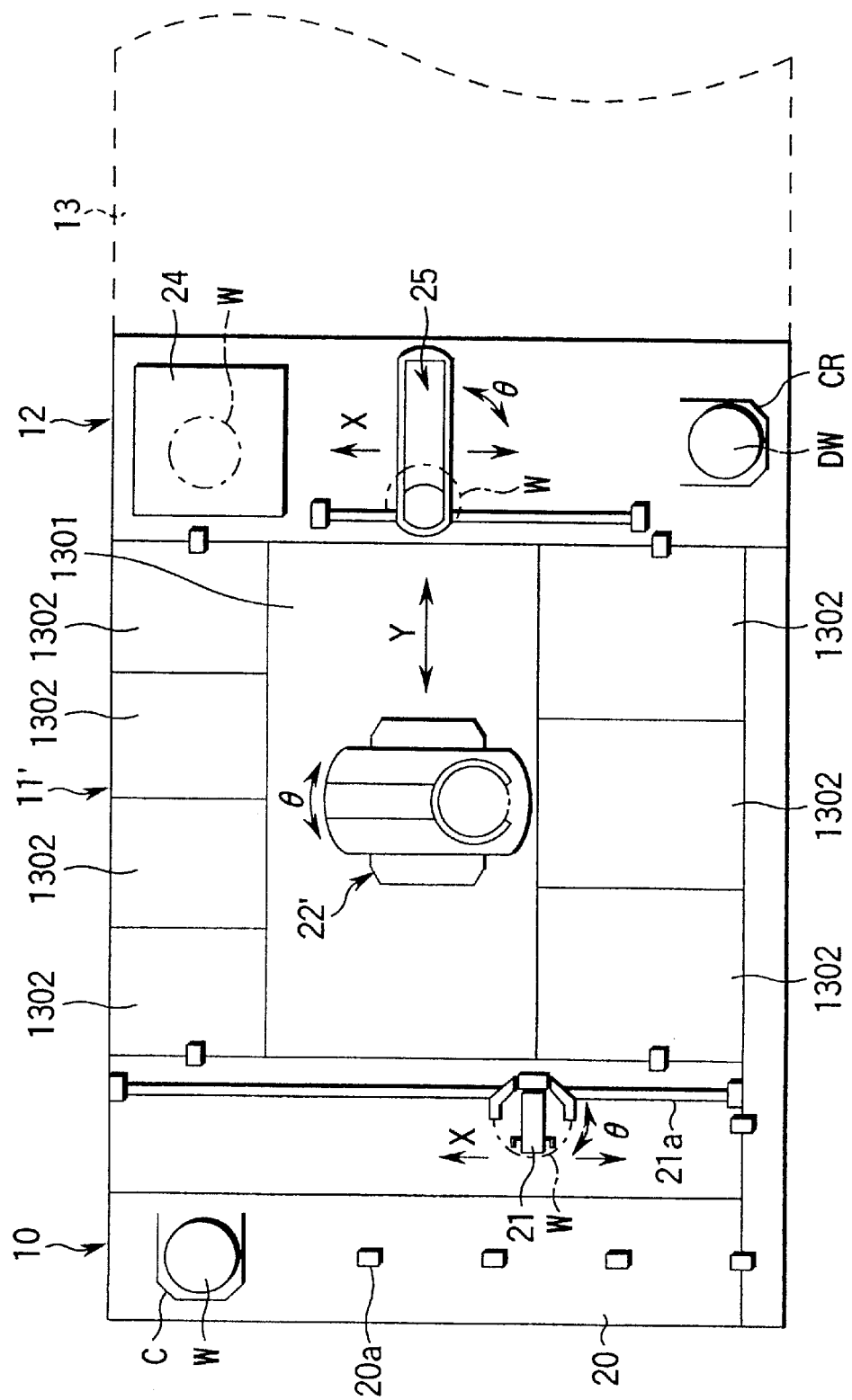
FIG. 13 is a plan view showing another embodiment of a resist processing apparatus to which the present invention is applicable.

In the above embodiments, the process station 11 has the carrier unit 22 with a vertical carrier system. However, as shown in FIG. 13, the present invention is applicable to a resist processing apparatus provided with a process station 11' in which a carrier unit 22' is movable in a Y-direction and process units 1302 such as a coating unit and a developing unit are disposed on both sides of a moving path 1301 of the carrier unit 22'.

In the above embodiments, examples of using a wafer W as a substrate are described, but the present invention is not limited to the above-described embodiments. The present invention is also applicable to an embodiment in which an LCD substrate is used.

In the above embodiments, examples of using a chilling hot plate as a thermal processing unit are described, but the present invention is not limited to the above-described embodiments. The present invention is also applicable to an embodiment in which an LHP (Low Hot Plate) or an HHP (High Hot Plate) is used.

The above-described embodiments have the intention of clarifying technical meaning of the present invention. Therefore, the present invention is not intended to be limited to the above concrete embodiments or to be interpreted in a narrow sense, and various changes may be made therein without departing from the spirit of the present invention and within the meaning of the claims.

What is claimed is:

1. A resist processing apparatus for coating a substrate with a resist, sending the substrate to an aligner and developing the substrate received from the aligner, said resist processing apparatus comprising:

a coating unit that coats the substrate with the resist;

a developing unit that develops the substrate received from the aligner;

an interface unit, through which the substrate is sent to and received from the aligner;

a carrier that carries the substrate from said coating unit to the aligner through said interface unit, and to carry the substrate from the aligner to said developing unit through said interface unit;

a thermal processing unit that heat-treats the substrate received from the aligner, the substrate being carried by said carrier from the aligner to said thermal processing unit through said interface unit;

a buffer unit where a heat-sensing substrate, which is provided with a sensor that measures temperature of said heat-sensing substrate and is configured to be heated in said thermal processing unit, stands by, said buffer unit arranged in said interface unit, such that said heat-sensing substrate is carried to said thermal processing unit by said carrier through a course the same as that of the substrate, so as for said heat-sensing substrate to have a heat history up to said thermal processing unit, the same as that of the substrate; and a reader that reads temperature sensed by said sensor.

2. The apparatus according to claim 1, wherein said reader comprises a measuring member disposed in said thermal processing unit and connected to said heat-sensing substrate while said heat-sensing substrate is being treated in said thermal processing unit.

3. The apparatus according to claim 2, wherein said sensor comprises an output terminal, and said measuring member comprises a pin functioning as an input terminal to be brought into contact with said output terminal.

4. The apparatus according to claim 3, wherein said thermal processing unit comprises a cover that moves up and down and covers the substrate or said heat-sensing substrate during a heat treatment, and said pin is arranged on said cover such that said pin is brought into contact with said output terminal when said heat-sensing substrate is covered with said cover.

5. The apparatus according to claim 1, wherein said thermal processing unit comprises a hot plate on which the substrate or said heat-sensing substrate is mounted and heated, and a cooling unit disposed adjacent to said hot plate.

6. The apparatus according to claim 1, wherein said heat-sensing substrate comprises a main body composed of a member identical to the substrate.

7. The apparatus according to claim 1, wherein said reader comprises a storage element disposed on said head-sensing substrate and stores data sensed by said sensor, and a member configured to read the data stored in said storage element.

8. The apparatus according to claim 7, wherein said heat-sensing substrate comprises a main body composed of a member identical to the substrate, and said storage element is formed using said main body as a raw material thereof.

9. The apparatus according to claim 1, wherein said reader comprises a transmitter disposed on said heat-sensing substrate and transmits data sensed by said sensor, and a receiver that receives the data transmitted by said transmitter.

10. The apparatus according to claim 9, wherein said transmitter and said receiver communicate with each other, using infrared rays.

11. A resist processing apparatus for coating a substrate with a resist, sending the substrate to an aligner and developing the substrate received from the aligner, said resist processing apparatus comprising:

a coating unit that coats the substrate with the resist;

a developing unit that develops the substrate received from the aligner;

a carrier that carries the substrate from said coating unit to the aligner, and to carry the substrate from the aligner to said developing unit;

a thermal processing unit that heat-treats the substrate received from the aligner, the substrate being carried by said carrier from the aligner to said thermal processing unit;

a buffer unit where a heat-sensing substrate, which is provided with a sensor for sensing temperature of said heat-sensing substrate and is configured to be heated in said thermal processing unit, stands by, said heat-sensing substrate being carried to said thermal processing unit by said carrier; and a reader that reads temperature sensed by said sensor, wherein said reader comprises a measuring member disposed in said thermal processing unit and connected to said heat-sensing substrate while said heat-sensing substrate is being heat-treated in said thermal processing unit, wherein said sensor comprises an output terminal, and said measuring member comprises a pin functioning as an input terminal to be brought into contact with said output terminal, and wherein said thermal processing unit comprises a cover that moves up and down and cover the substrate or said heat-sensing substrate during a heat treatment, and said pin is arranged on said cover such that said pin is brought into contact with said output terminal when said heat-sensing substrate is covered with said cover.

12. The apparatus according to claim 11, wherein said thermal processing unit comprises a hot plate on which the substrate or said heat-sensing substrate is mounted and heated, and a cooling unit disposed adjacent to said hot plate.

13. The apparatus according to claim 11, wherein said heat-sensing substrate comprises a main body composed of a member identical to the substrate.

14. The apparatus according to claim 11, wherein said reader further comprises a storage element disposed on said heat-sensing substrate and stores data sensed by said sensor, and a member configured to read the data stored in said storage element.

15. The apparatus according to claim 14, wherein said heat-sensing substrate comprises a main body composed of a member identical to the substrate, and said storage element is formed using said main body as a raw material thereof.

16. A method of measuring temperature of a thermal processing unit in a resist processing apparatus that coats a substrate with a resist, sending the substrate to an aligner and developing the substrate received from the aligner, said resist processing apparatus comprising:

a coating unit that coats the substrate with the resist, a developing unit that develops the substrate received from the aligner, an interface unit, through which the substrate is sent to and received from the aligner, a carrier that carries the substrate from said coating unit to the aligner through said interface unit, and to carry the substrate from the aligner to said developing unit through said interface unit, and a thermal processing unit that heat-treats the substrate received from the aligner, the substrate being carried by said carrier from the aligner to said thermal processing unit through said interface unit, said method comprising the steps of:

arranging in said interface unit a buffer unit where a heat-sensing substrate, which is provided with a sensor for sensing temperature of said heat-sensing substrate and is configured to be heated in said thermal processing unit, stands by;

carrying said heat-sensing substrate at a predetermined time by said carrier mechanism from said buffer unit to said thermal processing unit through a course the same as that of the substrate, so as for said heat-sensing substrate to have a heat history up to said thermal processing unit, the same as that of the substrate;

heat-treating said heat-sensing substrate in said thermal processing unit, while sensing temperature by said sensor; and reading the temperature sensed by said sensor by a reader.

17. The method according to claim 16, further comprising the step of detecting malfunction of the substrate, wherein said predetermined timing is when the malfunction of the substrate is detected.

18. The method according to claim 16, wherein said step of reading the temperature comprises the steps of connecting a measuring member of said reader disposed in said thermal processing unit to said heat-sensing substrate while said heat-sensing substrate is being heat-treated in said thermal processing unit.

19. The method according to claim 16, wherein the step of reading temperature further comprises a step of storing data sensed by said sensor into a storage element of said reader disposed on said heat-sensing substrate, and a step of reading the data stored in the storage element.

20. The method according to claim 16, wherein the step of reading temperature further comprises a step of transmitting data sensed by said sensor by a transmitter of said reader disposed on said heat-sensing substrate, and receiving the data transmitted by said transmitter by a receiver of said reader.

21. A resist processing method comprising:

coating a substrate with a resist in a coating unit;

carrying the substrate by a carrier from said coating unit to an aligner through an interface unit;

subjecting the substrate to an exposing-treatment in said aligner;

carrying the substrate by said carrier from said aligner to a thermal processing unit through said interface unit;

heat-treating the substrate in said thermal processing unit;

carrying the substrate by said carrier to a developing unit;

subjecting the substrate to a developing-treatment in said developing unit;

arranging in said interface unit a buffer unit where a heat-sensing substrate, which is provided with a sensor for sensing temperature of said heat-sensing substrate and is configured to be heated in said thermal processing unit, stands by;

carrying said heat-sensing substrate at a predetermined time by said carrier from said buffer unit to said thermal processing unit through a course the same as that of the substrate, so as for said heat-sensing substrate to have a heat history up to said thermal processing unit, the same as that of the substrate;

heat-treating said heat-sensing substrate in said thermal-processing unit, while sensing temperature by said sensor; and reading temperature sensed by said sensor by a reader.

* * * * *